(12) United States Patent
Rahman et al.

(10) Patent No.: US 9,201,305 B2
(45) Date of Patent: Dec. 1, 2015

(54) SPIN-ON COMPOSITIONS OF SOLUBLE METAL OXIDE CARBOXYLATES AND METHODS OF THEIR USE

(71) Applicants: M. Dalil Rahman, Flemington, NJ (US); Venkata Gopal Reddy Chada, Bridgewater, NJ (US); Huirong Yao, Plainsboro, NJ (US); Clement Anyadiegwu, Parlin, NJ (US); Douglas McKenzie, Easton, PA (US)

(72) Inventors: M. Dalil Rahman, Flemington, NJ (US); Venkata Gopal Reddy Chada, Bridgewater, NJ (US); Huirong Yao, Plainsboro, NJ (US); Clement Anyadiegwu, Parlin, NJ (US); Douglas McKenzie, Easton, PA (US)

(73) Assignee: AZ ELECTRONIC MATERIALS (LUXEMBOURG) S.A.R.L., Luxembourg (LU)

( * ) Notice: Subject to any disclaimer, the term of this patent is extended or adjusted under 35 U.S.C. 154(b) by 177 days.

(21) Appl. No.: 13/930,711

(22) Filed: Jun. 28, 2013

(65) Prior Publication Data

US 2015/0004801 A1      Jan. 1, 2015

(51) Int. Cl.
*H01L 21/033* (2006.01)
*G03F 7/09* (2006.01)
*H01L 21/027* (2006.01)
*C23C 18/06* (2006.01)
*C23C 18/12* (2006.01)
*C23C 18/14* (2006.01)

(52) U.S. Cl.
CPC .............. *G03F 7/092* (2013.01); *C23C 18/06* (2013.01); *C23C 18/1216* (2013.01); *C23C 18/14* (2013.01); *G03F 7/09* (2013.01); *G03F 7/091* (2013.01); *H01L 21/0276* (2013.01)

(58) Field of Classification Search
USPC .................................................. 427/226, 229
See application file for complete search history.

(56) References Cited

U.S. PATENT DOCUMENTS

| 3,035,071 | A | 5/1962 | Haslam |
| 3,474,054 | A | 10/1969 | White |
| 3,625,934 | A | 12/1971 | Rinse |
| 3,758,269 | A | 9/1973 | Bartsch et al. |
| 4,200,729 | A | 4/1980 | Calbo |
| 4,251,665 | A | 2/1981 | Calbo |
| 4,347,347 | A | 8/1982 | Yajima et al. |
| 4,361,691 | A | 11/1982 | Yajima et al. |
| 4,416,789 | A | 11/1983 | Shidlovsky et al. |
| 4,455,414 | A | 6/1984 | Yajima et al. |
| 4,491,628 | A | 1/1985 | Ito et al. |

(Continued)

FOREIGN PATENT DOCUMENTS

| EP | 1 798 599 A1 | 8/2007 |
| EP | 2 447 775 A1 | 5/2012 |

(Continued)

OTHER PUBLICATIONS

Form PCT/ISA/220, Form PCT/ISA/210, and Form PCT/ISA/237 for PPCT/EP2013/075815 dated Jul. 9, 2014 which corresponds to U.S. Appl. No. 13/707,993.

(Continued)

*Primary Examiner* — Vu A Nguyen
(74) *Attorney, Agent, or Firm* — Mitchell Brustein (57) ABSTRACT

The present disclosure relates to spin-on compositions containing at least one metal oxide dicarboxylate and an organic solvent into which the metal oxide dicarboxylate is soluble or colloidally stable. The dicarboxylate is capable of decomposing during heat treatment to give a cured metal oxide film. The present disclosure also relates to method of using the spin-on compositions.

21 Claims, 4 Drawing Sheets

Examples of Precursors

Ammonium Zirconium Carbonate

Zirconium(IV) oxide 2-ethylhexanoate

Zirconium (IV) Acetylacetonate

Zirconium Acetate

(56) References Cited

U.S. PATENT DOCUMENTS

| | | | |
|---|---|---|---|
| 4,526,766 A | 7/1985 | Ryan et al. | |
| 4,529,766 A | 7/1985 | Starmer | |
| 5,178,989 A | 1/1993 | Heller et al. | |
| 5,187,019 A | 2/1993 | Calbo et al. | |
| 5,350,660 A | 9/1994 | Urano et al. | |
| 5,548,050 A | 8/1996 | Kushibiki et al. | |
| 5,563,228 A | 10/1996 | Ogawa et al. | |
| 5,772,978 A | 6/1998 | Bailey et al. | |
| 5,843,624 A | 12/1998 | Houlihan et al. | |
| 5,879,859 A | 3/1999 | Buchwalter et al. | |
| 6,242,156 B1 | 6/2001 | Teng | |
| 6,348,299 B1 | 2/2002 | Aviram et al. | |
| 6,447,980 B1 | 9/2002 | Rahman et al. | |
| RE37,896 E * | 10/2002 | Tomida et al. | C23C 18/1216 427/126.1 |
| 6,723,488 B2 | 4/2004 | Kudo et al. | |
| 6,790,587 B1 | 9/2004 | Feiring et al. | |
| 6,818,258 B2 | 11/2004 | Kaneko et al. | |
| 6,849,377 B2 | 2/2005 | Feiring et al. | |
| 6,866,984 B2 | 3/2005 | Jung et al. | |
| 6,916,590 B2 | 7/2005 | Kaneko et al. | |
| 7,416,834 B2 | 8/2008 | Abdallah et al. | |
| 7,560,580 B2 | 7/2009 | Shin et al. | |
| 7,727,902 B2 | 6/2010 | Takei et al. | |
| 7,767,368 B2 | 8/2010 | Fukushima et al. | |
| 7,799,396 B2 | 9/2010 | Uehara et al. | |
| 7,803,458 B2 | 9/2010 | Flaim et al. | |
| 8,039,201 B2 | 10/2011 | Yao et al. | |
| 8,343,691 B2 | 1/2013 | Mizushima et al. | |
| 8,367,771 B2 | 2/2013 | Shin et al. | |
| 8,568,958 B2 | 10/2013 | Yao et al. | |
| 2003/0235786 A1 | 12/2003 | Krishnamurthy et al. | |
| 2004/0029041 A1 | 2/2004 | Shih et al. | |
| 2004/0058275 A1 | 3/2004 | Nef et al. | |
| 2004/0102048 A1 | 5/2004 | Yamaguchi | |
| 2004/0181031 A1 | 9/2004 | Nogi et al. | |
| 2004/0224616 A1 | 11/2004 | Shiho et al. | |
| 2005/0164133 A1 | 7/2005 | Rangarajan et al. | |
| 2006/0263708 A1 | 11/2006 | Wu et al. | |
| 2007/0015083 A1 | 1/2007 | Babich et al. | |
| 2007/0116640 A1 | 5/2007 | Kim et al. | |
| 2007/0224483 A1* | 9/2007 | Alberti et al. | 429/33 |
| 2007/0243473 A1 | 10/2007 | Mizushima et al. | |
| 2007/0260025 A1 | 11/2007 | Elder et al. | |
| 2008/0044764 A1 | 2/2008 | Takahashi et al. | |
| 2008/0076064 A1 | 3/2008 | Sun | |
| 2009/0239080 A1 | 9/2009 | Ito et al. | |
| 2009/0286188 A1 | 11/2009 | Hatakeyama et al. | |
| 2010/0028804 A1 | 2/2010 | Iwato et al. | |
| 2010/0099044 A1 | 4/2010 | Hatakeyama et al. | |
| 2010/0130697 A1 | 5/2010 | Katayama et al. | |
| 2011/0081615 A1 | 4/2011 | Kon | |
| 2011/0207864 A1 | 8/2011 | Nakamura et al. | |
| 2011/0213190 A1 | 9/2011 | Cazaux et al. | |
| 2012/0178261 A1 | 7/2012 | Kanno et al. | |
| 2012/0223418 A1 | 9/2012 | Stowers et al. | |
| 2012/0264039 A1 | 10/2012 | Ito et al. | |
| 2012/0288300 A1 | 11/2012 | Matsusaki et al. | |
| 2012/0323008 A1 | 12/2012 | Barry et al. | |
| 2012/0328990 A1 | 12/2012 | Yao et al. | |
| 2013/0040140 A1 | 2/2013 | Joo et al. | |
| 2013/0123137 A1 | 5/2013 | Reichardt et al. | |
| 2014/0000948 A1 | 1/2014 | Nagai et al. | |
| 2014/0159278 A1 | 6/2014 | Yao et al. | |
| 2014/0273447 A1 | 9/2014 | Ogihara et al. | |
| 2014/0356792 A1 | 12/2014 | Noya | |
| 2015/0024522 A1 | 1/2015 | Wang et al. | |
| 2015/0064904 A1 | 3/2015 | Yao et al. | |
| 2015/0200090 A1 | 7/2015 | Chada et al. | |
| 2015/0200091 A1 | 7/2015 | Chada et al. | |

FOREIGN PATENT DOCUMENTS

| | | |
|---|---|---|
| JP | 63-56529 A1 | 3/1988 |
| JP | 3-138922 A | 6/1991 |
| JP | 6-32756 A | 2/1994 |
| JP | 2000-10293 A | 1/2000 |
| JP | 2005-307101 A | 11/2005 |
| JP | 2006-98284 A | 4/2006 |
| JP | 2007-61720 A | 3/2007 |
| JP | 2009-173910 A | 8/2009 |
| WO | WO 2011/032837 A1 | 3/2011 |

OTHER PUBLICATIONS

Baxendale et al., "The Reduction of Molybdenum(II) Trifluoroacetate by Pulse Radiolysis in Methanol[1]", Journal of the American Chemical Society vol. 98 No. 2, pp. 637-pp. 638 (1976).

Burch et al., "Scrambling of Fluoro-, Methoxyl, Dimethylamino-, and Methyl Gropus with Chlorine Atoms of Methoxyl with Dimethylaminol-Groups on Germanium", J. Chm. Soc. (A), pp. 586-pp. 589 (1966).

Sartori et al., "Ober die Darstellung and Eigenschaften von Perflouracyloxy-Verbindungen der vierten Gruppe des Periodensystems*" Chem. Ber. vol. 100 No. 6, pp. 2049-pp. 2063 (1967).

Form PCT/IB/326, Form PCT/IB/373, and Form PCT/ISA/237 for PCT/IB2012/001219 dated Jan. 9, 2014, which corresponds to U.S. Appl. No. 13/164,869.

Office Action notification date Mar. 11, 2015 for U.S. Appl. No. 14/237,720.

Form PCT/ISA/220, Form PCT/ISA/210, and Form PCT/ISA/237 dated Feb. 6, 2015 for PCT/EP2014/076919, which corresponds to U.S. Appl. No. 14/015,222.

Restriction Requirement notification date Mar. 12, 2015 for U.S. Appl. No. 13/707,993.

International Search Report for PCT/JP2012/070426 date of mailing Sep. 4, 2012, which corresponds to U.S. Appl. No. 14/237,720.

Machine Language English Abstract from JPO of 3-138922 A.

D. Abdallah et al., "Image Reversal Trilayer Process Using Standard Positive Photoresist", SPIE vol. 7273, No. 72732K, pp. 72732K-1-pp. 72732K-9 (2009).

D. Bajuk-Bogdanovic, "A Study of 12-tungstosilicic acid and 12-molybdophosphoric acids in solution," Journal of the Serbian Chemical Society vol. 73(2), pp. 197-pp. 209 (2008).

H. Levy et al., "Structure of Silico-Tungstic acid in Aqueous solution", The Journal of Chemical Physics vol. 30 No. 6, pp. 1486-pp. (1959).

J. Meador et al., "193-nm Multilayer Imaging Systems", SPIE vol. 5039, pp. 948-pp. 959 (2003).

J. Meador et al., "New Materials for 193-nm Trilayer Imaging", SPIE vol. 5376, pp. 1136-pp. 1148 (2004).

S. Moon of al., Three-Component Photopolymers Based on Thermal Cross-Linking and Acidolytic De-Cross-Linking of Vinyl Ether Groups. Effects of Binder Polymers on Photopolymer Characterictics, Chem. Mater. vol. 6, pp. 1854-pp. 1880 (1994).

M. Pope et al., "Polyoxymetalate Chemistry: An Old Field with New Dimensions in Several Disciplines", Angew. Chem. Int. Ed. Engl. vol. 30, pp. 34-pp. 48 (1991).

H. Schacht et al., "Acid Labile Cross-Liked Units: A Concept for Improved Positive Deep-UV Photoresists", ACS Symp. Ser. 706, pp. 78-pp. 94 (1998).

A. Scroggie et al., "The Crystal Structure of Anhydrous Silicotungstic Acid and Related Compounds, and Their Probable Molecular Formulas," Proceedings of the National Academy of Sciences vol. 15, No. 1, pp. 1-pp. 8 (1929).

T. Yamaoka et al., "Reactions of vinyl ethers and application to photoreactive process", Trends in Photochemistry and. Photobiology vol. 7, pp. 45-pp. 70 (2001).

Satterfield, C. W., Heterogeneous Catalysis in Industrial Practice, 2nd Edition, McGraw-Hill, Inc., New York, Chapter 1, pp. 1-pp. 30 (1991).

(56) References Cited

OTHER PUBLICATIONS

Notification of the First Office Action dated Sep. 1, 2014 from the Chinese Patent Office for CN2012800262639, which corresponds to U.S. Appl. No. 13/164,869.
English Translation of Notification of the First Office Action dated Sep. 1, 2014 from the Chinese Patent Office for CN2012800262639, which corresponds to U.S. Appl. No. 13/164,869.
English Language Abstract from JPO of JP 63-56529 A.
Notice of Allowance and Fee(s) Due date mailed Jun. 27, 2013 for U.S. Appl. No. 13/162,869.
Form PCT/ISA/220, Form PCT/ISA/210, and Form PCT/ISA/237 for PCT/IB2012/001219 dated Oct. 19, 2012, which corresponds to U.S. Appl. No. 13/164,869.
"alkylenes", PAC, 1995, 67, 1307, (Glossary of class names of organice compounds and reactivity intermediates based on structure (IUPAC Recommendations 1995) on p. 1314, obtained from hhtp://goldbook.iupac.org/I00227-plain.html on Mar. 11, 2013.
Form PCT/ISA/220, Form PCT/ISA/210, and Form PCT/ISA/237 dated Aug. 11, 2014 for PCT/EP2014/063593 which corresponds to U.S. Appl. No. 13/930,711.
Form PCT/ISA/220, Form PCT/ISA/210, and Form PCT/ISA/237 dated Nov. 28, 2014 for PCT/EP2014/067749, which corresponds to U.S. Appl. No. 14/015,222.
Notice of Allowance and Fee(s) Due notification date Jun. 24, 2015 for U.S. Appl. No. 14/237,720.
Restriction Requirement notification date May 11, 2015 for U.S. Appl. No. 14/015,222.
Office Action notification date Jul. 10, 2015 for U.S. Appl. No. 14/154,929.
Machine Language English Abstract from JPO of JP 3-138922 A.
Office Action notification date Aug. 27, 2015 for U.S. Appl. No. 13/707,993.
Office Action notification date Sep. 3, 2015 for U.S. Appl. No. 14/015,222.
Jia et al., "Multi-Dimensionai Transition-Metal Coordination Polymers of 4, 4'-Bipyridine-N,N'-dioxide:: 1D Chains and 2D Sheets", Inorg. Chem. vol. 47 No. 19, pp. 8652-pp. 8664 (2008).
Lubben et al., "Dioxygen Activation by Group 4 tritox Alkyls (tritox + t-Bu3CO-): Insertion and Oxygen Atom transfer", J. Am. Chem. Soc. vol. 109 No. 2, pp. 424-pp. 435 (1987).
Pigget at al, "Synthesis, Structure, and Magnetochemical Analysis of Selected First-Row Transition-Metal Anilino- and Anisolesquarate Compounds", Inorg. Chem. vol. 43 No. 3, pp. 1167-pp. 1174 (2004).
Tao et al., "Novel liquid lithium borates characterized with high lithium ion transference numbers", J. Power Sources vol. 135, pp. 267-pp. 272 (2004).
Zuniga et al., "Lithium Aryloxo Magnesiates: an Examination of Ligand Size and Donor Effects", Inorg. Chem. vol. 46 No. 24, pp. 10400-pp. 10409 (2007).
Office Action notification date Aug. 17, 2015 for U.S. Appl. No. 14/445,757.

* cited by examiner

Figure 1: Examples of Precursors

Ammonium Zirconium Carbonate

Zirconium(IV) oxide 2-ethylhexanoate

Zirconium (IV) Acetylacetonate

Zirconium Acetate

Figure 2: Examples of Crosslinkable Polymers

Figure 2: Examples of Crosslinkable Polymers (continued)

Figure 2: Examples of Crosslinkable Polymers (continued)

SPIN-ON COMPOSITIONS OF SOLUBLE METAL OXIDE CARBOXYLATES AND METHODS OF THEIR USE

FIELD OF INVENTION

The present invention relates to spin-on compositions of organic solvent stable metal oxide carboxylate materials that can be used to prepare a variety of underlayers suitable for photolithographic processes. The metal oxide carboxylate compounds have improved stability. The present invention also relates to processes for preparing such underlayers using the inventive compositions.

BACKGROUND

Metal oxide films are useful in a variety of applications in the semiconductor industry such as, for example, lithographic hardmasks, underlayers for anti-reflective coatings and electro-optical devices.

As an example, photoresist compositions are used in microlithography processes for making miniaturized electronic components such as in the fabrication of computer chips and integrated circuits. Generally, a thin coating of a photoresist composition is applied to a substrate, such as silicon based wafer used for making integrated circuits. The coated substrate is then baked to remove a desired amount of solvent from the photoresist. The baked coated surface of the substrate is then image-wise exposed to actinic radiation, such as, visible, ultraviolet, extreme ultraviolet, electron beam, particle beam and X-ray radiation.

The radiation causes a chemical transformation in the exposed areas of the photoresist. The exposed coating is treated with a developer solution to dissolve and remove either the radiation-exposed or the unexposed areas of the photoresist.

The trend towards the miniaturization of semiconductor devices has led to the use of new photoresists that are sensitive to shorter and shorter wavelengths of radiation and has also led to the use of sophisticated multilevel systems to overcome difficulties associated with such miniaturization.

Absorbing antireflective coatings and underlayers in photolithography are used to diminish problems that result from radiation that reflects from substrates which often are highly reflective. Reflected radiation results in thin film interference effects and reflective notching. Thin film interference, or standing waves, result in changes in critical line width dimensions caused by variations in the total light intensity in the photoresist film as the thickness of the photoresist changes. Interference of reflected and incident exposure radiation can cause standing wave effects that distort the uniformity of the radiation through the thickness. Reflective notching becomes severe as the photoresist is patterned over reflective substrates containing topographical features, which scatter light through the photoresist film, leading to line width variations, and in the extreme case, forming regions with complete loss of desired dimensions. An antireflective coating film coated beneath a photoresist and above a reflective substrate provides significant improvement in lithographic performance of the photoresist. Typically, the bottom antireflective coating is applied on the substrate and cured followed by application of a layer of photoresist. The photoresist is imagewise exposed and developed. The antireflective coating in the exposed area is then typically dry etched using various etching gases, and the photoresist pattern is thus transferred to the substrate.

Underlayers containing high amount of refractory elements can be used as hard masks as well as antireflective coatings. Hard masks are useful when the overlying photoresist is not capable of providing high enough resistance to dry etching that is used to transfer the image into the underlying semiconductor substrate. In such circumstances a material called a hard mask whose etch resistance is high enough to transfer any patterns created over it into the underlying semiconductor substrate. This is made possible because the organic photoresist is different than the underlying hard mask and it is possible to find an etch gas mixture which will allow the transfer of the image in the photoresist into the underlying hard mask. This patterned hard mask can then be used with appropriate etch conditions and gas mixtures to transfer the image from the hard mask into the semiconductor substrate, a task which the photoresist by itself with a single etch process could not have accomplished.

Multiple antireflective layers and underlayers are being used in new lithographic techniques. In cases where the photoresist does not provide sufficient dry etch resistance, underlayers and/or antireflective coatings for the photoresist that act as a hard mask and are highly etch resistant during substrate etching are preferred. One approach has been to incorporate silicon, titanium, zirconium or other metallic materials into a layer beneath the organic photoresist layer. Additionally, another high carbon content antireflective or mask layer may be placed beneath the metal containing antireflective layer, such as a trilayer of high carbon film/hardmask film/photoresist used to improve the lithographic performance of the imaging process. Conventional hard masks can be applied by chemical vapor deposition, such as sputtering. However, the relative simplicity of spin coating versus the aforementioned conventional approaches makes the development of a new spin-on hard mask or antireflective coating with high concentration of metallic materials in the film very desirable.

Underlayer compositions for semiconductor applications containing metal oxides have been shown to provide dry etch resistance as well as antireflective properties. When higher concentrations of metal oxide are present in the underlayer, improved etch resistance and thermal conductance can be achieved. Conventional metal oxide compositions, however, have been found to be very unstable to moisture in air creating a variety of issues, including shelf life stability, coating problems and performance shortcomings. As well, conventional compositions generally contain non-metal oxide materials such as polymers, crosslinkers and other materials that detract from the metal oxide properties required for etch resistance and thermal conductivity. Thus there is an outstanding need to prepare spin-on hardmask, antireflective and other underlayers that contain high levels of stable soluble metal oxides which are soluble or colloidally stable.

SUMMARY OF THE DISCLOSURE

The present invention relates to spin-on compositions of organic solvent soluble metal oxide carboxylate materials that can be used to prepare a variety of underlayers suitable for photolithographic processes. The metal oxide carboxylate compounds have improved stability. The present invention also relates to processes for preparing such underlayers using the inventive compositions.

In a first embodiment, disclosed and claimed herein are spin-on compositions comprising at least one metal oxide dicarboxylate, wherein the dicarboxylate is capable of decomposing during heat treatment to give an oligomeric metal oxide film, and an organic solvent into which the metal oxide dicarboxylate is soluble. The carboxylate of the dicarboxylate may be a substituted or unsubstituted, saturated or unsaturated, branched or unbranched $C_3$-$C_6$ carboxylate, such as, for example, a propionate.

In a second embodiment, disclosed and claimed herein are spin-on compositions of the above embodiment, wherein the metal is at least one high refractive metal chosen from Ti, V, Cr, Zr, Nb, Mo, Ru, Rh, Hf, Ta, W, Re, and Ir, such as, for example, the metal oxide may be comprised of zirconium and optionally titanium.

In a third embodiment, disclosed and claimed herein are spin-on compositions of the above embodiment, further comprising an organic polymer capable of crosslinking during heat treatment, and wherein the metal oxide dicarboxylate is capable of thermally decomposing to give a film with high metal oxide content.

In a fourth embodiment, disclosed and claimed herein are methods of manufacturing an electronic device comprising, applying a composition of any of the above embodiments to a substrate, and heating the coated substrate. The heating can be from about 200° C. to about 500° C. for about 30 to about 200 seconds.

In a fifth embodiment, disclosed and claimed herein are methods of the above method embodiments wherein the carboxylate of the dicarboxylate may be a substituted or unsubstituted, saturated or unsaturated, branched or unbranched $C_3$-$C_6$ carboxylate, such as, for example, a propionate.

In a sixth embodiment, disclosed and claimed herein are methods of the above embodiment wherein the metal is at least one high refractive metal chosen from Ti, V, Cr, Zr, Nb, Mo, Ru, Rh, Hf, Ta, W, Re, and Ir, such as, for example, zirconium and optionally titanium.

In a seventh embodiment, disclosed and claimed herein are methods of the above embodiment, wherein the composition further comprises an organic polymer which crosslinks during heat treatment, and wherein the metal oxide dicarboxylate thermally decomposes to give a film with high metal oxide content.

DETAILED DESCRIPTION

As used herein, the conjunction "and" is intended to be inclusive and the conjunction "or" is not intended to be exclusive unless otherwise indicated. For example, the phrase "or, alternatively" is intended to be exclusive.

As used herein, the term "and/or" refers to any combination of the foregoing elements including using a single element.

As used herein the terms "composition" and "formulation" are used interchangeable and mean the same thing.

As used herein the phrase "high metal oxide content" means a content higher than about 50% based on weight percentages.

Disclosed and claimed herein are spin-on compositions of metal oxide dicarboxylate materials that are soluble in organic solvents that are typically used in spin-on coating processes. They have been found to be more moisture stable that the currently available materials based on alkoxy metal oxides. The metal oxide dicarboxylates have the following structure:

R can be a substituted or unsubstituted, saturated branched or unbranched $C_3$-$C_6$ carboxylate ligand, such as, for example, propanoic or isopropanoic; butanoic, isobutanoic, sec-butanoic, or tert-butanoic; pentanoic or any of the pentanoic isomers; hexanoic or any of the hexanoic isomers. Unsaturated, branched or unbranched, $C_3$-$C_6$ carboxylate ligands may also be used, such as, for example, acrylic, methacrylic, butenoic, pentenoic, hexenoic carboxylates or their isomers. The carboxylates may be substituted with hydroxides, halides, chalcogens, and the like, substituted either in the chain or attached to the chain.

Figure 1:
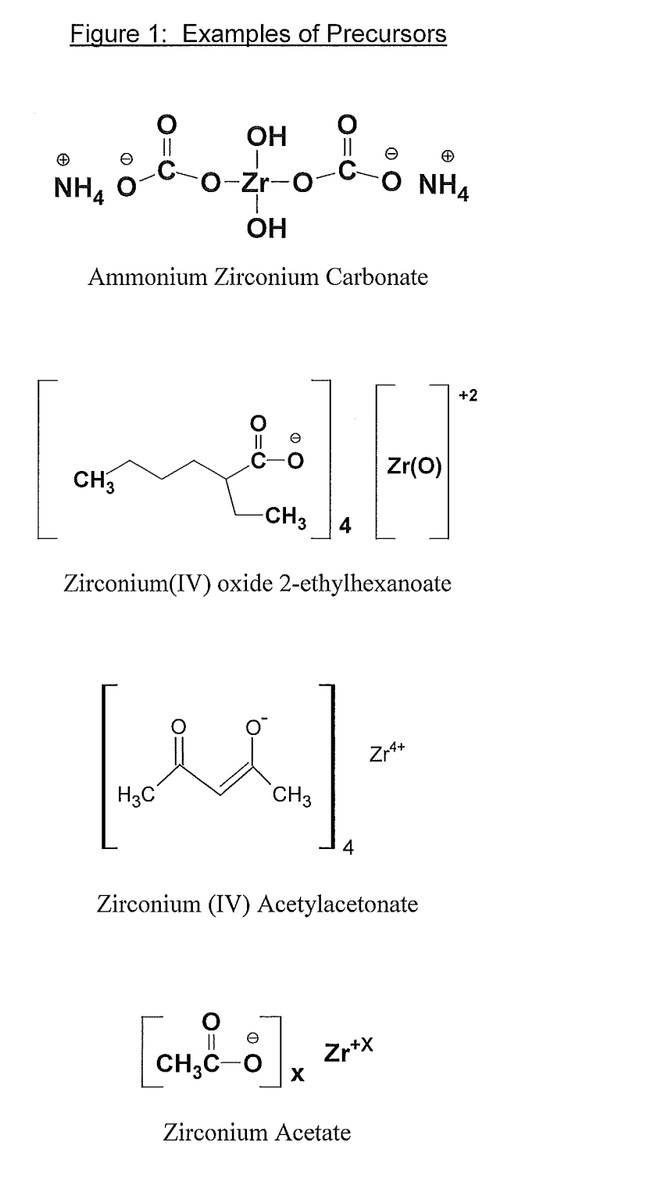
FIG. 1 shows examples of precursors useful for the preparation of the current metal oxide dicarboxylates.
Figure 2:
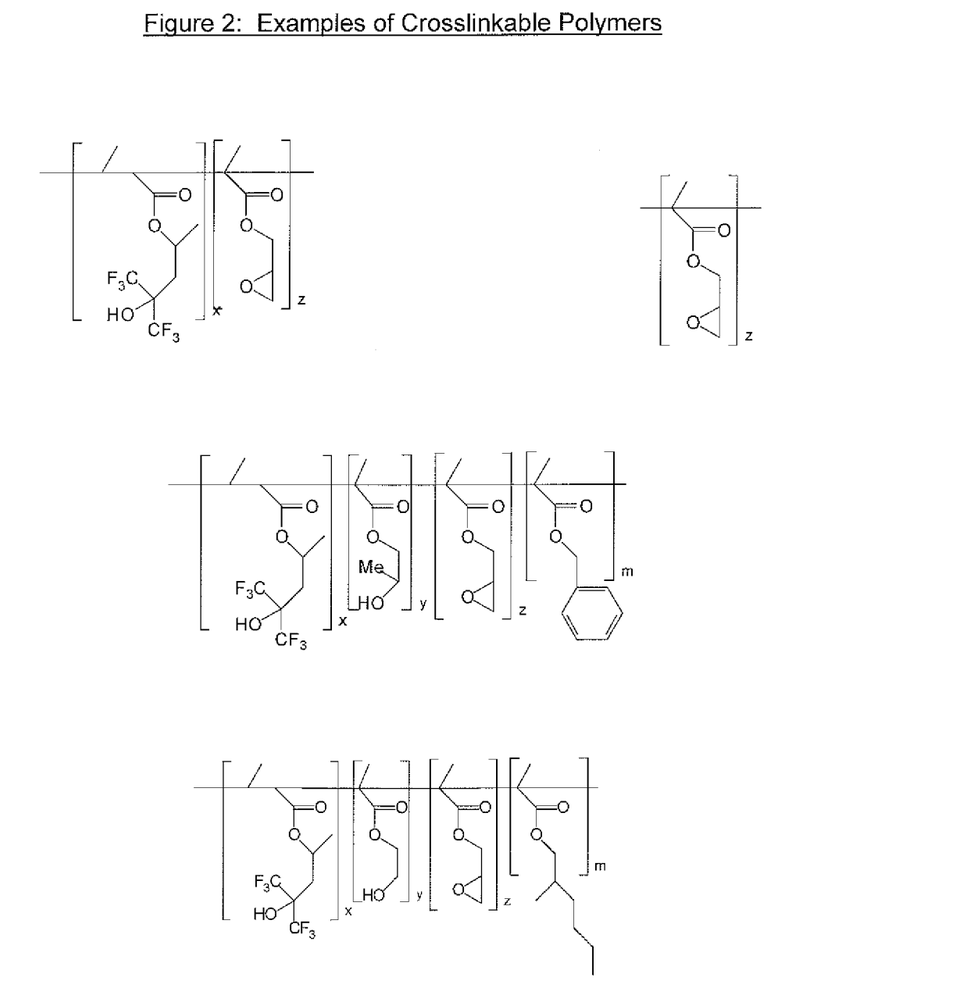
FIG. 2 shows examples of crosslinking polymers useful for the current compositions.

M, in the metal oxide dicarboxylate, is at least one metal chosen from titanium, vanadium, zirconium, tantalum, lead, antimony, thallium, indium, ytterbium, gallium, hafnium, niobium, molybdenum, ruthenium, rhodium, tantalum, rhenium, osmium, iridium, aluminum, magnesium, germanium, tin, iron, cobalt, nickel, copper, zinc, gold, silver, chromium, cadmium, tungsten and platinum. A typical metal oxide dicarboxylates has the following structure:

The metal oxide dicarboxylates are prepared from a number of different precursors, such as, for example, ammonium zirconium carbonate:

or zirconium acetate:

where x is 2-4 and other examples of precursors are listed in FIG. 1, such as ammonium zirconium carbonate, zirconium (IV) oxide 2-ethylhexanoate, zirconium (IV) acetylacetonate and zirconium acetate.

In some examples the precursor is at least one colloidally stable nanoparticle with average particle sizes from about 5 nm to about 50 nm, or 5-25 nm or 5-20 nm. Not to be held to theory, it is believed that the metal oxide nanoparticle precursor reacts with a carboxylic acid or carboxylic acid salt to form a surface layer of metal oxide dicarboxylate surrounding the novel nanoparticle. The resultant carboxylated metal oxide nanoparticle is also stable in the solvent.

More than one metal may be included in the composition depending on the desired properties of the final crosslinked layer. For example, zirconium and titanium may be combined to give a layer with very good etch resistance, thermal conductivity and high refractive index. The amount of each metal in the metal oxide carboxylate in the solution can range from about 5 wt % to about 50 wt % depending on the desired characteristics of the final cured metal oxide layer.

The metal oxide dicarboxylates are soluble in solvents that are typically used in lithographic spin-on processes. Examples of suitable solvents for the current disclosure include ethers, esters, ether esters, ketones and ketone esters and, more specifically, ethylene glycol monoalkyl ethers, diethylene glycol dialkyl ethers, propylene glycol monoalkyl ethers, propylene glycol dialkyl ethers, acetate esters, hydroxyacetate esters, lactate esters, ethylene glycol monoalkylether acetates, propylene glycol monoalkylether acetates, alkoxyacetate esters, (non-)cyclic ketones, acetoacetate esters, pyruvate esters and propionate esters. The aforementioned solvents may be used independently or as a mixture of two or more types. Furthermore, at least one type of high boiling point solvent such as benzylethyl ether, dihexyl ether, diethylene glycol monomethyl ether, diethylene glycol monoethyl ether, acetonylacetone, caproic acid, capric acid, 1-octanol, 1-nonanol, benzyl alcohol, benzyl acetate, ethyl benzoate, diethyl oxalate, diethyl maleate, γ-butyrolactone, ethylene carbonate, propylene carbonate and phenylcellosolve acetate may be added to the aforementioned solvent.

Methods for preparing the metal oxide dicarboxylates are described in the examples below. Generally a precursor is dissolved in a suitable solvent and the acid or salt form of the desired carboxylate is added slowly. In some cases, such as for example, with the ammonium zirconium carbonate, gaseous by-products are generated which then leave the admixture. The total percent solids in the chosen solvent or solvent blend is between about 1-about 30% wt/wt, such as, for example, about 2% to about 10% wt/wt.

It has surprisingly been found that the current metal oxide dicarboxylates of the current disclosure decompose during thermal processing to give a highly crosslinked metal oxide layer. Not to be held to theory it is believed that the dicarboxylate decompose at curing temperatures and either evaporate as the carboxylate or as volatile composition products. What remains behind is highly crosslinked metal oxide films.

The compositions of the current disclosure can be coated onto the surface of a substrate such as low dielectric constant materials, silicon, silicon substrates coated with a metal surface, copper coated silicon wafer, copper, aluminum, polymeric resins, silicon dioxide, metals, doped silicon dioxide, silicon nitride, tantalum, polysilicon, ceramics, aluminum/copper mixtures, any of the metal nitrides such as AlN; gallium arsenide and other such Group III/V compounds. The substrate may also be other antireflective coatings or underlayers, such as high carbon underlayers coated over the above mentioned substrates. The substrate may comprise any number of layers made from the materials described above.

The compositions of the current disclosure are coated on the substrate using techniques well known to those skilled in the art, such as dipping, spin coating, curtain coating, slot coating, spraying and the like. The film thickness of the coating ranges from about 5 nm to about 1000 nm, or about 10 nm to about 520 nm or about 50 to 400 nm. The coated metal oxide dicarboxylate composition is then heated on a hot plate or convection oven at curing temperatures to drive off the carboxylate substituents. The cure temperature may be from about 200° C. to about 500° C. for about 1 to about 10 minutes, such as, for example, from about 250° C. to about 450° C. for about 1 to about 2 minutes. The composition may be coated over other layers of antireflective coatings, such as a high carbon (greater than 80% or 85% or 90%) content antireflective coating. Once cooled, other materials can be coated onto the surface of the highly crosslinked metal oxide such as, for example, photoresists.

The metal oxide dicarboxylate compositions of the current disclosure may further contain an organic or inorganic polymer capable of crosslinking during heat treatment, wherein the metal oxide dicarboxylate thermally decomposes while the polymer thermally crosslinks to give a composite film with high metal oxide content.

Polymers such as film forming organic or silicon based polymer are used, such as, for example, polyacrylics, polymethacrylates, and condensation polymers such as polyesters, novolac resins, siloxane resins or organosilsesquioxanes. These polymers may be used alone or in combination with each other depending on the desired properties of the final film after curing. These polymers are generally crosslinking polymer, containing any of a number of the same or different crosslinking substituents, such as, for example, epoxies, hydroxyls, thiols, amines, amides, imides, esters, ethers, ureas, carboxylic acids, anhydrides, and the like. Other examples of crosslinking groups include the glycidyl ether group, glycidyl ester group, glycidyl amino group, methoxymethyl group, ethoxy methyl group, benzyloxymethyl group, dimethylamino methyl group, diethylamino methyl group, dimethylol amino methyl group, diethylol amino methyl group, morpholino methyl group, acetoxymethyl group, benzyloxy methyl group, formyl group, acetyl group, vinyl group and isopropenyl group. Polymers disclosed in U.S. Pat. No. 8,039,201 and incorporated herein by reference may be used.

The polymer of the coating composition can comprise at least one unit of structure (1) comprising a hydrophobic moiety, at least one unit of structure (2) comprising a chromophore moiety, at least one unit of structure (3) comprising a crosslinking moiety (3) and optionally a unit comprising a group capable of crosslinking the polymer, where the structures 1-3 may be represented by, (1)

(2)

(3)

where, $R_1$ to $R_9$ are independently selected from hydrogen and $C_1$-$C_4$ alkyl; $W_1$ is a fully or partially fluorinated group; X is selected from F, H, and OH; $W_2$ is an organic moiety comprising a chromophore group, and $W_3Y$ comprises a crosslinking moiety. In the polymer, the unit comprising the hydrophobic moiety, $W_1$, is a fully or partially fluorinated group. $W_1$ is preferably a nonaromatic group, and may be selected from a fluorinated aliphatic alkylene and partially fluorinated aliphatic alkylene such as a $C_1$-$C_{20}$ alkylene selected from linear alkylene, branched alkylene, cyclic alkylene and mixtures of these. The alkylene group may be substituted by other functionalities, such as alkoxy and alkyl carboxyl groups. In one embodiment $W_1$ is not a multicyclic aliphatic alkylene and is also not aromatic and may be a fully or partially fluorinated $C_1$-$C_{20}$ alkylene which is selected from linear, branched, monocyclic, and mixture of these. $W_1$ may be represented by fully or partially fluorinated $C_1$-$C_{20}$ alkylene, such as fully or partially fluorinated moieties of methylene, ethylene, propylene, isopropylene, butylene, 1-hexylethylene, etc; further such as 3,5 bishexafluromethylene-hexane. X in structure (1) may be selected from F, H, and OH. In one embodiment X is OH. Further examples of the unit (1) are given in FIG. 1. The backbone of the polymer may be an acrylate or a methacrylate.

In one embodiment of unit (1) of the polymer, X is fluorine and $W_1$ is a fully or partially fluorinated aliphatic $C_1$-$C_{20}$ alkylene. Further examples of $W_1X$ are fully fluorinated aliphatic $C_1$-$C_{20}$ alkanes which are linear, branched, monocyclic or mixtures of these, such as pentafluoropropyl, 2,2,2-trifluoroethyl, and heptafluorobutyl, etc.

In one embodiment, the unit (1) in the polymer of the present novel composition may have the structure, (4)

where, $R_1$ to $R_3$ are independently hydrogen and $C_1$-$C_4$ alkyl, $W'_1$ may be selected from a single bond, an alkylene, substituted alkylene, such as a $C_1$-$C_{20}$ alkylene selected from linear, branched, cyclic and mixtures of these. The alkylene may be substituted with other functionalities such as alkoxy, alkyl carboxyl groups, partially or fully fluorinated alkylene hydroxy groups. Preferably W'1 is a nonaromatic group, and may be selected from a fluorinated aliphatic alkylene and partially fluorinated aliphatic alkylene such as a $C_1$-$C_{20}$ alkylene selected from linear alkylene, branched alkylene, monocyclic alkylene and mixtures of these. $W'_1$ may be represented by fluorinated aliphatic alkylene, partially fluorinated aliphatic alkylene, where the alkylene may be cyclic, linear, branched or a mixture of these. In another embodiment, $W'_1$ is selected from $C_1$-$C_{12}$ linear alkylene, $C_1$-$C_{12}$ branched alkylene, $C_1$-$C_{12}$ monocyclic alkylene and mixtures thereof, where the alkylene may be substituted with other functionalities such as alkoxy, alkyl carboxyl groups, and partially or fully fluorinated alkylene hydroxy groups. In yet another embodiment $W'_1$ is selected from methylene, ethylene, propylene, isopropylene, 1-hexylethylene, and 3-hexafluoropropanol-hexane.

In the polymer of the present invention, $W_2$ in structure (2) is an organic moiety comprising the chromophore group, where the chromophore group is capable of absorbing the radiation used to expose the photoresist coated over the film of the present antireflective coating composition, such as aromatic groups; examples of chromophore groups are unsubstituted phenyl and substituted phenyl, particularly for 193 nm radiation. Other chromophores may also be used, such as unsubstituted naphthyl, substituted naphthyl, unsubstituted anthracyl, and substituted anthracyl for 248 nm radiation. The chromophore group may be substituted with moieties such as hydroxy, esters, ethers, alkyl carboxyl, etc. The chromophore group may be directly linked to the backbone of the polymer or be part of an organic moiety. The organic moiety can be any essentially hydrocarbon moiety comprising carbon and hydrogen, and may additionally contain oxygen. The chromophore group may be attached to the polymer backbone by an ester group. The chromophore group may be attached through a connecting group, where the connecting group may be an ester, alkylene group, alkyleneoxyalkylene group, alkoxy group, etc. Examples of an alkylene group may be $C_1$-$C_{20}$ alkylene selected from linear, branched, cyclic and mixtures of these. Preferably the connecting group is an aliphatic alkylene or ester. Examples of connecting groups may be methylene, ethylene, propylene, etc. Further examples of $W_2$ are phenyl methylene, phenyl, naphthyl, methylene naphthyl, anthracyl, methylene anthracyl, etc. An example of structure (2) is structure (2')

(2')

where $R_4$ to $R_6$ are independently hydrogen and $C_1$-$C_4$ alkyl, and $W'_2$ is an chromophore group connected directly or through a $C_1$-$C_{12}$ alkylene group, where the chromophore group is as described previously. $W'_2$ may be a chromophore group. Specific examples of $W'_2$ may be a phenyl group, a substituted phenyl group, benzyl group or a substituted phenyl group. The polymer may be an acrylate or a methacrylate polymer.

In the polymer of the present invention the unit with the crosslinking site is one capable of causing the polymer to be crosslinked, such that it comprises a group which can crosslink the polymer and become a crosslinking site or provide a site where crosslinking with another group can take place. Groups which can crosslink the polymer are for example epoxy groups, methylol groups, uril groups, etc. Groups which can provide a possible crosslinking site useful for reacting with crosslinking groups are hydroxy. Thus Y in structure (3) could be an epoxy, hydroxy, methylol, uril, etc. Epoxy groups are capable of selfcrosslinking the polymer and do not require an external crosslinking compound. One embodiment of Y is epoxy. One embodiment of Y is hydroxy. If Y is hydroxy and the polymer does not contain a crosslinking group within the polymer, then an external crosslinking compound may be added to the composition. The moiety Y may be connected to the ester group through $W_3$. Preferably $W_3$ is a nonaromatic group, such as an aliphatic group. $W_3$ may be an aliphatic alkylene group, aliphatic alkylene ether group, etc. Examples of an alkylene group may be $C_1$-$C_{20}$ alkylene selected from linear, branched, cyclic and mixtures of these. Examples of $W_3$ are methylene, ethylene, propylene, butylenes, hexylenes, etc. The polymer of the present composition may contain unit of structure (1), a unit of structure (2) and one or more types of unit (3). The polymer may contain multiple types of unit (3), such as one unit where Y is hydroxy and one unit where Y is epoxy. Specific examples of $W_3Y$ are methylene epoxy, ethylene epoxy, hexylenemethylene epoxy, etc.

The polymer present in the novel composition may comprise additional (meth)acrylate monomeric units, such as in structure (5).

(5)

where $R_{10}$-$R_{12}$ are independently selected from hydrogen and $C_1$-$C_4$ alkyl, $W_4$ is $C_1$-$C_{10}$ alkyl, $C_1$-$C_{10}$ alkyleneetheralkyl, substituted $C_1$-$C_{10}$ alkyl, and substituted $C_1$-$C_{10}$ alkyleneetheralkyl. The substitution may be alkoxy, alkylcarboxyl, alkylester, etc.

In one embodiment of the polymer, the polymer comprises the units shown in structure (6), where x, y, z, m and n are mole % of the monomeric units shown, x can range from about 1-50 mole %, preferably about 5-30 mole %; y can range from about 0-50 mole %, preferably about 5-50 mole %; z can range from about 0-50 mole %; m can range from about 5-50 mole % and n can range from about 0-50 mole %, providing y and/or z is greater than 1 mole %.

The polymer, when used, is less than about 80% based on solids, such as, for example, less than 50% based on solids. Crosslinking additives may also be present between 15-40% based on solids. Other additives typical of coating additive may be added, such as, for example, wetting agents, surfactants, anti-foam agent, thixotropic agents and the like.

The compositions of the current disclosure contain about 1 weight % to about 30 weight % of the metal oxide dicarboxylate based on total composition, or about 2-15 weight %, or about 3-10 weight %. The cured metal film has a metal content in the range of about 10 to about 85 weight % after 200-300° C. for about 60-120 seconds, or about 10 to about 70 weight %, or about 30 to about 65%, or about 40 to about 65 weight % or about 40 to about 60 weight % based on the total weight of the cured film. In particular, cured zirconium or titanium oxide films formed from the novel composition have a metal content in the range of about 10 to about 70 weight % after 200-300° C. for about 60-120 seconds, or about 20 to about 70 weight %, or about 40 to about 60 weight % or about 20 to about 70 weight %.

The cured metal oxide film can be removed using a stripping agent, including, for example, 85% phosphoric acid, 3% HF, 10% TMAH, 10% hydrogen peroxide and aqueous alkaline peroxides. Stripping time ranges from about 30 seconds to about 120 seconds at about room temperature to about 70° C. depending on the film curing conditions. Other stripping processes may be employed in conjunction with processing conditions of the cured metal oxide film. For example, when the film is cured at a lower temperature or a shorter time, the stripper may be diluted, the time may be shortened and/or the temperature of stripping may be reduced.

The metal oxide dicarboxylates of the current disclosure, their compositions and methods of use can be used to prepare lithographic antireflective layer. Sufficient chromophore groups are present, and the refractive indices of the underlayer n (refractive index) can range from about 1.8 to about 2.2 and k (extinction coefficient) can range from about 0.1 to about 0.5 at 193 nm exposure wavelength.

The refractive indices of the polymer or composition, n (refractive index) and k (extinction coefficient) are parameters which relate to the complex refractive index $n_c$, are defined as follows, $$n_c = n - jk$$

(6)

(Handbook of Semiconductor Manufacturing Technology Edited by Yoshio Nishi et al, Marcel Dekker Inc, 2000 page 205).

The novel coatings are useful as a hard mask. The n and k values can be calculated using an ellipsometer, such as the J. A. Woollam WVASE VU-32™ Ellipsometer. The exact values of the optimum ranges for k and n are dependent on the exposure wavelength used and the type of application. Typically for 193 nm the preferred range for k is about 0.1 to about 0.6, and for 248 nm the preferred range for k is about 0.15 to about 0.8, however, other exposure wavelengths such as, for example DUV and beyond DUV can be used and the compositions tuned to work in conjunction with them, as shown in Table 2, below.

The photoresist compositions are applied over the cured novel coating by such processes as spin coating, and the like, as described herein. After coating, the solvent is removed to a level wherein the coating can be properly exposed. In some cases a residual of 5% solvent may remain in the coating while in other cases less than 1% is required. Drying can be accomplished by hot plate heating, convection heating, infrared heating and the like. The coating is imagewise exposed with actinic radiation through a mark containing a desired pattern. A film of photoresist is coated on top of the underlayer coating and baked to substantially remove the photoresist solvent. An edge bead remover may be applied after the coating steps to clean the edges of the substrate using processes well known in the art.

Photoresists can be any of the types used in the semiconductor industry, provided the photoactive compound in the photoresist and the antireflective coating substantially absorb at the exposure wavelength used for the imaging process. Photoresists useful for immersion lithography are preferred. Typically, photoresists suitable for imaging with immersion lithography may be used, where such photoresists have a refractive index higher than 1.85 and also are hydrophobic having water contact angle in the range of 75° to 95°.

To date, there are several major deep ultraviolet (uv) exposure technologies that have provided significant advancement in miniaturization, and have actinic radiation of 250 nm to 10 nm, such as 248 nm, 193 nm, 157 and 13.5 nm. Chemically amplified photoresist are often used. Photoresists for 248 nm have typically been based on substituted polyhydroxystyrene and its copolymers/onium salts, such as those described in U.S. Pat. No. 4,491,628 and U.S. Pat. No. 5,350,660. On the other hand, photoresists for exposure at 193 nm and 157 nm require non-aromatic polymers since aromatics are opaque at this wavelength. U.S. Pat. No. 5,843,624 and U.S. Pat. No. 6,866,984 disclose photoresists useful for 193 nm exposure. Generally, polymers containing alicyclic hydrocarbons are used for photoresists for exposure below 200 nm. Alicyclic hydrocarbons are incorporated into the polymer for many reasons, primarily since they have relatively high carbon to hydrogen ratios which improve etch resistance, they also provide transparency at low wavelengths and they have relatively high glass transition temperatures. U.S. Pat. No. 5,843,624 discloses polymers for photoresist that are obtained by free radical polymerization of maleic anhydride and unsaturated cyclic monomers. Any of the known types of 193 nm photoresists may be used, such as those described in U.S. Pat. No. 6,447,980 and U.S. Pat. No. 6,723,488, and incorporated herein by reference. Two basic classes of photoresists sensitive at 157 nm, and based on fluorinated polymers with pendant fluoroalcohol groups, are known to be substantially transparent at that wavelength. One class of 157 nm fluoroalcohol photoresists is derived from polymers containing groups such as fluorinated-norbornenes, and are homopolymerized or copolymerized with other transparent monomers such as tetrafluoroethylene (U.S. Pat. No. 6,790,587, and U.S. Pat. No. 6,849,377) using either metal catalyzed or radical polymerization. Generally, these materials give higher absorbencies but have good plasma etch resistance due to their high alicyclic content. More recently, a class of 157 nm fluoroalcohol polymers was described in which the polymer backbone is derived from the cyclopolymerization of an asymmetrical diene such as 1,1,2,3,3-pentafluoro-4-trifluoromethyl-4-hydroxy-1,6-heptadiene (U.S. Pat. No. 6,818,258) or copolymerization of a fluorodiene with an olefin (U.S. Pat. No. 6,916,590). These materials give acceptable absorbance at 157 nm, but due to their lower alicyclic content as compared to the fluoro-norbornene polymer, have lower plasma etch resistance. These two classes of polymers can often be blended to provide a balance between the high etch resistance of the first polymer type and the high transparency at 157 nm of the second polymer type. Photoresists that absorb extreme ultraviolet radiation (EUV) of 13.5 nm are also useful and are known in the art. Thus photoresists absorbing in the range of about 12 nm to about 250 nm are useful. The novel coatings can also be used in process with nanoimprinting and e-beam resists.

After the coating process, the photoresist is imagewise exposed. The exposure may be done using typical exposure equipment. The exposed photoresist is then developed in an aqueous developer to remove the treated photoresist. The developer is preferably an aqueous alkaline solution comprising, for example, tetramethylammonium hydroxide (TMAH), typically 2.38 weight % TMAH. The developer may further comprise surfactant(s). An optional heating step can be incorporated into the process prior to development and after exposure.

The process of coating and imaging photoresists is well known to those skilled in the art and is optimized for the specific type of photoresist used. The photoresist patterned substrate can then be dry etched with an etching gas or mixture of gases, in a suitable etch chamber to remove the exposed portions of the underlayers and optional other antireflective coatings. Various etching gases are known in the art for etching underlayer coatings, such as those comprising $O_2$, $CF_4$, $CHF_3$, $Cl_2$, HBr, $SO_2$, CO, etc. In one embodiment, the article comprises a semiconductor substrate with a high carbon antireflective film, over which the novel metal layer is coated. A photoresist layer is coated above this. The photoresist is imaged as disclosed above and the metal underlayer is dry etched using gases comprising fluorocarbons. After the metal underlayer is etched, the high carbon film can be dry etched using oxygen or oxygen mixtures. Advantageously the novel metal layer may be removed using a stripper which is a chemical solution, as described herein.

Each of the documents referred to above are incorporated herein by reference in its entirety, for all purposes. The following specific examples will provide detailed illustrations of the methods of producing and utilizing compositions of the present invention. These examples are not intended, however, to limit or restrict the scope of the invention in any way and should not be construed as providing conditions, parameters or values which must be utilized exclusively in order to practice the present invention.

EXAMPLES

The refractive index (n) and the extinction coefficient (k) values of the carbon hard mask antireflective coating in the Examples below were measured on a J. A. Woollam VASE32 ellipsometer.

The molecular weight of the polymers was measured on a Gel Permeation Chromatograph using a Water 2695 Alliance Separation Module, or equivalent equipped with a Waters Dual Wavelength UV Detector, Model 2487, or equivalent and a Waters Differential Refractometer, Model 2414, Detector equivalent, a Shodex Columns set as follows: one Shodex GPC KF-801 ($1.5 \times 10^3$) column, Two Shodex GPC KF-802 ($5 \times 10^3$) columns and one Shodex GPC KF-804 ($4 \times 10^5$) column. The mobile phase was UV stabilized THF HPLC grade and the molecular weight standard was as set of polystyrene standards supplied by American Standards Corporation and Millipore Corporation or equivalent.

The TGA analysis was done using a Perkin Elmer-TGA7-Thermogravimeteric Analyser in the presence of oxygen from 50-900° C.

Composition Example 1

20.0 g of Zirconium oxide propionate from Gelest Inc., Morrisville Pa. was placed into a reaction vessel and 180 g of propylene glycol monomethyl ether acetate (PGMEA) was added. After shaking over night the formulation was filtered through a 0.2 μm filter.

Composition Example 2

18.0 g of ammonium zirconium carbonate (20 wt % $ZrO_2$) from Aldrich Chemical Company, St. Louis, Mo., was placed in a reaction vessel and 18 gms of propionic acid was slowly added dropwise. While adding these acids, ammonia and carbon dioxide gases were released. When the reaction was completed, it formed a foam type white solid compound. 30 gms of PGMEA was then added. After shaking for 2 to 3 hours the formulation was filtered by 0.2 μm filter.

Composition Example 3

20 gms of $ZrO_2$ nanoparticle solution (20 wt %) stabilized with acetate ions obtained from Nyacol Nano Technology, Inc., Ashland, Mass., (average particle size of around 5-10 nm, initial pH of the solution was 3.5) was placed in a reaction vessel. 10 gms of acrylic acid was added dropwise under constant stirring. 30 gms of a 70/30 blend of PGMEA and propylene glycol monomethyl ether (PGME) was added. After 4 to 5 hrs of shaking, the formulation was filtered using a 0.2 μm filter.

Composition Example 4

15 gms of zirconium acetate solution in diluted acetic acid (16 wt % Zr) obtained from Aldrich Chemical Company was placed in a reaction vessel and 10 gms of acrylic acid was added under constant stirring. 25 gms of ArF thinner was then added. After 4-5 hrs shaking the solution was filtered with 0.2 μm filter.

Composition Example 5

4 gms of ethylene glycol and 20 gms of zirconium acetate solution in diluted acetic acid (16 wt % Zr) from Aldrich Chemical Company were added to a reaction vessel and slowly heated to remove the water from the solution, increasing the viscosity of the precursor and ultimately forming a gel. 2 gms of acrylic acid was added followed by 40 gms PGMEA.

Composition Example 6

20.0 g of Zirconium oxide propionate from Gelest Inc., Morrisville Pa. was placed into a reaction vessel and 180 g of PGMEA was added. After shaking overnight the formulation was filtered through a 0.2 μm filter. 22.2 g of a 10% solution of the polymer of Example 9 in ArF Thinner was added to give a composition with a 90/10 proportion of metal oxide to polymer and filtered again through a 0.2 μm filter.

Composition Example 7

20.0 g of Zirconium oxide propionate from Gelest Inc., Morrisville Pa. was placed into a reaction vessel and 180 g of PGMEA was added. After shaking overnight the formulation was filtered through a 0.2 μm filter. 50.0 g of a 10% solution of the polymer of Example 9 in ArF Thinner was added to give a composition with a 80/20 proportion of metal oxide to polymer and filtered again through a 0.2 μm filter.

Composition Example 8

20.0 g of Zirconium oxide propionate from Gelest Inc., Morrisville Pa. was placed into a reaction vessel and 180 g of PGMEA was added. After shaking overnight the formulation was filtered through a 0.2 μm filter. 85.7 g of a 10% solution of the polymer of Example 9 in ArF Thinner was added to give a composition with a 70/30 proportion of metal oxide to polymer and filtered again through a 0.2 μm filter.

Polymer Synthesis Example 9

9.7 g of 1,1,1-trifluoro-2-trifluoromethyl-2-hydroxy-4-pentyl methacrylate, 5.8 g of benzyl methacrylate, 5.1 g of 2-hydroxyethyl methacrylate and 6.4 g of glycidyl methacrylate, were mixed with in 120 g of tetrahydrofuran (THF) solvent. The polymerization reaction took place in the presence of 1.0 g of azobisisobutyronitrile (AIBN) at 75° C. under nitrogen for 20 hrs. After cooling down to room temperature, the reaction mixture was precipitated in deionized (DI) water. The white polymer solid was washed and dried under vacuum at 45° C. with a yield of 26.5 g (99%). The $M_w$ of polymer measured by GPC was 19,000.

Evaluation of Resistance to Solvents and Developer

Propyleneglycol monomethylether acetate/propyleneglycol monomethylether (PGMEA/PGME) 70:30 solvent was dispensed on the silicon wafer coated with materials from Composition Examples 1, 6, 7 and 8 at indicated temperatures in Table 1. Nitrogen blowing was used to remove the solvent after 60 seconds. No significant film losses were observed. Similar experiments were performed with developer 2.38% wt/wt tetramethyl ammonium hydroxide (TMAH). The films from Table 1 and Table 2 showed good resistance to developer.

TABLE 1

Soak Test of Films in Various Solvents

| Composition | Cure parameters | Soak Solvent (60 sec) | Result |
| --- | --- | --- | --- |
| Example 1 | 250° C./120 sec | TMAH | All passed |
| Example 6 | 240° C./60 sec | 70/30 PGMEA/PGME | |
| Example 7 | 240° C./60 sec | Ethyl lactate | |
| Example 8 | 240° C./60 sec | | |

Evaluation of the Refractive Index (n) and Extinction Coefficient (k)

The n and k values can be calculated using an ellipsometer, such as the J. A. Woollam WVASE VU-32™ Ellipsometer. The exact values of the optimum ranges for k and n are dependent on the exposure wavelength used and the type of application. Typically for 193 nm the preferred range for k is about 0.1 to about 0.6, and for 248 nm the preferred range for k is about 0.15 to about 0.8, however, other exposure wavelengths such as, for example DUV and beyond DUV can be used and the compositions tuned to work in conjunction with them, as shown in Table 2, below.

TABLE 2

Refractive Index (n) and Extinction Coefficient (k) of Composition Examples

| Composition | Cure Temp | Film Thickness (Å) | n@ 193 nm | k@ 193 nm | n@ 248 nm | k@ 248 nm | n@ 633 nm | k@ 633 nm |
|---|---|---|---|---|---|---|---|---|
| Example 1 | 250° C./120 sec | 260.82 | 2.0633 | 0.28212 | 1.7633 | 0.0003 | 1.5811 | 0.001 |
| Example 6 | 240° C./60 sec | 496.61 | 2.0040 | 0.22040 | 1.7294 | 0 | 1.578 | 0 |
| Example 7 | 240° C./60 sec | 433.52 | 1.9534 | 0.22186 | 1.6912 | 0 | 1.5544 | 0 |
| Example 8 | 240° C./60 sec | 551.23 | 1.9114 | 0.22123 | 1.668 | 0 | 1.5397 | 0 |

Evaluation of the Bulk Etch Resistance

The bulk etch resistance of the cured films in Table 3 were carried out using $CF_4$ etchant. The coatings were subjected to the etchant for 60 or 40 seconds at a power of 500 watts and base pressure of 137 Pa. The etch rates were based on the average of 2 wafers.

TABLE 3

Bulk Etch Resistance of examples in $CF_4$

| Formulation | Initial Film Thickness (Å) | Change in Film Thickness (Å) | Etch Rate Å/sec |
|---|---|---|---|
| Example 1 | 4033 | 120.5 (60 sec) | 6.03 |
| Example 7 | 4759 | 47 (60 sec) | 2.35 |
| Example 3 | 2136 | 109 (40 sec) | 2.72 |
| Example 2 | 1977 | 135 (40 sec) | 3.36 |

Evaluation of the Bulk Etch Resistance

The bulk etch resistance of the cured films with materials from Example 1, at 250° C./120 sec. bake, were carried out using different gases, under the condition of 2 Pa/Chamber 500 W/Platen 200 W/40 sccm $Cl_2$/4 sccm $CF_4$/25 sccm Ar/266 Pa He. Back Pressure/20 deg C. Electrode Temp using ULVAC NE5000N from ULVAC Technologies, Inc. 401 Griffin Brook Drive, Methuen, Mass.

TABLE 4

Bulk Etch Resistance in different gases

| Gas | Etch Rate nm/min |
|---|---|
| $CF_4$ | 53.0 |
| $O_2/N_2$/Air | 65.3 |
| $Cl_2$/Ar/$CF_4$ | 46.2 |
| $Cl_2/O_2$ | 29.7 |

Determination of Metal % in Cured Films

The metal % wt/wt in the cured metal oxide films were measured by elemental analysis and TGA weight loss measurement. The results from two methods were consistent. The metal content in the film from Example 1 was 60 weight % after 200° C. for about 60-120 seconds film heating.

Lithographic Evaluation Example 1

The performance of the Zr metallic anti-reflective coating formulation was evaluated using AZ® 2110P photoresist (product of AZ Electronic Materials USA Corp., Somerville, N.J.). A silicon wafer was coated with Composition Example 1 and baked at 240° C. for 60 seconds to form a 200 nm thick film. Then using AZ® EXP AX2110P photoresist film of 160 nm was coated on top and baked at 100° C. for 60 seconds. The wafer was then imaged using a 193 nm Nikon 306D exposure tool with a Numerical Aperture (NA) of 0.85, with Y-Dipole Illumination of 0.85 outer sigma, and 0.55 inner sigma. The exposed wafer was then baked at 110° C. for 60 seconds and developed using AZ® 300MIF developer (TMAH) (product of AZ Electronic Materials USA Corp., Somerville, N.J.) for 30 seconds. The top down and cross-section patterns when observed under scanning electron microscope showed no significant collapse in the process window. Pattern profile was observed at Line/Space 81.67 nm 1:1 with photospeed of 36 mJ/$cm^2$.

Lithographic Evaluation Example 2

The performance of the Zr metallic anti-reflective coating formulation was evaluated using AZ® 2110P photoresist (product of AZ Electronic Materials USA Corp., Somerville, N.J.). A silicon wafer was coated with Formulation from Example 1 and baked at 350° C. for 120 seconds to form a 200 nm thick film. Then using AZ® EXP AX2110P photoresist film of 160 nm was coated on top and baked at 100° C. for 60 seconds. The wafer was then imaged using a 193 nm Nikon 306D exposure tool with a Numerical Aperture (NA) of 0.85, with Y-Dipole Illumination with a 0.85 outer sigma, and 0.55 inner sigma. The exposed wafer was then baked at 110° C. for 60 seconds and developed using AZ® 300MIF developer (TMAH) for 30 seconds. The top down and cross-section patterns when observed under scanning electron microscope showed no significant collapse in the process window. Pattern profile was observed at Line/Space 80 nm, 160 nm pitch photospeed of 30 mJ/$cm^2$.

We claim:

1. A spin-on composition comprising at least one metal oxide dicarboxylate and an organic solvent, where the metal oxide dicarboxylate is soluble or colloidally stable in the solvent, and wherein the metal oxide dicarboxylate is capable of decomposing during heat treatment at a temperature between about 200° C. to about 300° C. for about 30 to about 200 seconds to give a cured metal oxide film and further where the solvent is comprised of ethylene glycol monoalkyl ethers, diethylene glycol dialkyl ethers, propylene glycol monoalkyl ethers, propylene glycol dialkyl ethers, acetate esters, hydroxyacetate esters, lactate esters, ethylene glycol monoalkylether acetates, propylene glycol monoalkylether acetates, alkoxyacetate esters, (non-)cyclic ketones, acetoacetate esters, pyruvate esters, propionate esters, or mixtures of these solvents.

2. The composition of claim 1, wherein the carboxylate of the dicarboxylate is selected from a group consisting of a substituted $C_3$-$C_6$ carboxylate, unsubstituted $C_3$-$C_6$ carboxylate, saturated $C_3$-$C_6$ carboxylate, unsaturated $C_3$-$C_6$ carboxylate, branched $C_3$-$C_6$ carboxylate and unbranched $C_3$-$C_6$ carboxylate.

3. The composition of claim 1, wherein the carboxylate of the dicarboxylate is propionate.

4. The composition of claim 1, wherein the metal in the metal oxide dicarboxylate is at least one high refractive metal selected from Ti, V, Cr, Zr, Nb, Mo, Ru, Rh, Hf, Ta, W, Re, and Ir.

5. The composition of claim 1, wherein the metal oxide dicarboxylate is a nanoparticle.

6. The composition of claim 5 wherein the carboxylate of the dicarboxylate is propionate.

7. The composition of claim 1, wherein the metal oxide dicarboxylate is zirconium oxide dicarboxylate or titanium oxide dicarboxylate.

8. The composition of claim 7, wherein the carboxylate of the dicarboxylate is propionate.

9. The composition of claim 1, further comprising at least one polymer selected from a group consisting of an organic polymer, an inorganic polymer, and mixtures thereof.

10. The composition of claim 9, where the polymer can comprise at least one unit of structure (1) comprising a hydrophobic moiety, at least one unit of structure (2) comprising a chromophore moiety, at least one unit of structure (3) comprising a crosslinking moiety (3) and optionally a unit comprising a group capable of crosslinking the polymer, where the structures 1-3 may be represented by, (1)

(2)

(3)

where, $R_1$ to $R_9$ are independently selected from hydrogen and $C_1$-$C_4$ alkyl; $W_1$ is a fully or partially fluorinated group; X is selected from a group consisting of F, H, and OH; $W_2$ is an organic moiety comprising a chromophore group, and $W_3Y$ comprises a crosslinking site.

11. A method of manufacturing an electronic device comprising:
   a. applying a composition of claim 1 to form a metal oxide dicarboxylate film, and
   b. heating the coated substrate, thereby forming a cured metal oxide film.

12. The method of claim 11, wherein the metal content of the metal oxide film after the heating step is in the range of 10 to 85 weight %.

13. The method of claim 12, wherein the metal is at least one high refractive metal selected from the group consisting of Ti, V, Cr, Zr, Nb, Mo, Ru, Rh, Hf, Ta, W, Re, and Ir.

14. The method of claim 11, wherein a photoresist film is formed above the metal film.

15. The method of claim 14, wherein the photoresist film is imaged with radiation in the range of about 12 nm to about 250 nm and developed to form a pattern.

16. The method of claim 11, where the heating step is in the range of 200° C. to 500° C.

17. The method of claim 11, where the metal is zirconium.

18. The method of claim 11, where the metal is titanium.

19. The method of claim 11, wherein the metal content of the metal oxide film after the heating step is in the range of 10 to 70 weight %.

20. A spin-on composition comprising at least one metal oxide dicarboxylate and an organic solvent, where the metal oxide dicarboxylate is soluble or colloidally stable in the solvent, and wherein the metal oxide dicarboxylate is capable of decomposing during heat treatment at a temperature between about 200° C. to about 300° C. for about 30 to about 200 seconds to give a cured metal oxide film and further wherein the metal oxide dicarboxylate is a nanoparticle.

21. A spin-on composition comprising at least one metal oxide dicarboxylate and an organic solvent, where the metal oxide dicarboxylate is soluble or colloidally stable in the solvent, and wherein the metal oxide dicarboxylate is capable of decomposing during heat treatment at a temperature between about 200° C. to about 300° C. for about 30 to about 200 seconds to give a cured metal oxide film and further comprising at least one polymer selected from a group consisting of an organic polymer, an inorganic polymer, and mixtures thereof.

* * * * *